United States Patent [19]

Hahn et al.

[11] Patent Number: 4,954,189
[45] Date of Patent: Sep. 4, 1990

[54] SILICON WAFERS FOR PRODUCING OXIDE LAYERS OF HIGH BREAKDOWN STRENGTH AND PROCESS FOR THE PRODUCTION THEREOF

[75] Inventors: Peter Hahn, Burghausen; Hubert Piontek, Burgkirchen; Anton Schnegg; Werner Zulehner, both of Burghausen, all of Fed. Rep. of Germany

[73] Assignee: Wacker-Chemitronic Gesellschaft fur Elektronic-Grundstoffe mbH, Burghausen, Fed. Rep. of Germany

[21] Appl. No.: 250,395

[22] Filed: Sep. 28, 1988

[30] Foreign Application Priority Data

Nov. 6, 1987 [DE] Fed. Rep. of Germany ....... 3737815

[51] Int. Cl.$^5$ ................. H01L 21/304; H01L 21/306; H01L 21/322
[52] U.S. Cl. .................... 148/33.2; 148/33.3; 437/12; 437/228; 437/239
[58] Field of Search ........... 437/10, 11, 12, 13, 437/225, 228, 239, 248, 173; 156/636; 148/33.2, 33.3

[56] References Cited

U.S. PATENT DOCUMENTS

| | | | |
|---|---|---|---|
| 3,923,567 | 12/1975 | Lawrence | 156/7 |
| 4,042,419 | 8/1977 | Heinke et al. | 437/10 |
| 4,144,099 | 3/1979 | Edmonds et al. | 437/10 |
| 4,231,809 | 11/1980 | Schmidt | 357/91 |
| 4,276,114 | 6/1981 | Takano et al. | 156/645 |
| 4,376,657 | 3/1983 | Nagasawa et al. | 437/10 |
| 4,390,392 | 6/1983 | Robinson et al. | 156/643 |
| 4,659,400 | 4/1987 | Garbis et al. | 437/10 |
| 4,731,516 | 3/1988 | Noguchi et al. | 219/121.66 |

FOREIGN PATENT DOCUMENTS

| | | | |
|---|---|---|---|
| 9430 | 11/1983 | European Pat. Off. | |
| 3148957 | 6/1983 | Fed. Rep. of Germany | 437/10 |
| 54-0004064 | 1/1979 | Japan | 437/10 |
| 61-20337 | 1/1986 | Japan | |
| 62-0004327 | 1/1987 | Japan | 437/10 |

Primary Examiner—Olik Chaudhuri
Attorney, Agent, or Firm—Collard, Roe & Galgano

[57] ABSTRACT

Silicon wafers and a process for the production thereof which produces wafers having intrinsic gettering action and on which thin oxide layers with high breakdown strength can be produced. During the production, the wafers are subjected to a treatment which smooths the wafer surface, for example, by repolishing, after the intrinsic getters have been produced in the interior of the wafer. Oxide layers subsequently deposited are outstanding for an increased breakdown strength compared with untreated wafers.

18 Claims, No Drawings

SILICON WAFERS FOR PRODUCING OXIDE LAYERS OF HIGH BREAKDOWN STRENGTH AND PROCESS FOR THE PRODUCTION THEREOF

BACKGROUND OF THE INVENTION

1. Field of the Invention

This invention relates to silicon wafers for producing oxide layers of high breakdown strength and a process for the production thereof.

2. Description of the Prior Art

With increasing miniaturization in the production of electronic components, increasing requirements are imposed on the silicon wafers used as a starting material. In this connection, the production of thin oxide layers having high breakdown strength is increasingly important. The main reason for this is that, in particular with highly integrated components, thin oxide layers are more frequently provided as structural elements which layers are required to have an excellent breakdown strength.

Such oxide layers are frequently described in the art as "gate-oxide". In most cases, these oxide layers are produced in the surface region of silicon wafers which have, in their interior, regions formed by a preceding treatment which possess gettering action. These interior regions are adjacent at least one surface zone free of such gettering centers which is in general up to about 50 $\mu$m thick and in which the structures actually active in the production of the components are laid down.

An example of a treatment for producing such characteristics is the precipitation of the oxygen contained in the wafers, which is used in particular in silicon obtained by the Czochralski crucible pulling technique. In this material the oxygen content is typically in the range of $10^{14} - 2 \times 10^{18}$ atoms/cm$^3$. In this case, a temperature treatment produces oxygen precipitations (so-called "precipitates") in the interior of the wafers. These oxygen precipitations, because of their intrinsic gettering action, are of great importance for the processes which are used for the actual component production, which processes take place in the peripheral zone of the wafers which is free of such precipitates ("denuded zone"). These relationships and procedures are known and are explained in more detail, for example, in the paper entitled "Advanced CZ crystal production for VLSI applications" by H. Walitzki and M. Blätte, published in VLSI Science and Technology (1984), pages 10–18, and also in the other literature cited in that article.

Apart from the formation of oxygen precipitates, other known processes for producing intrinsic getters in silicon wafers are insignificant and are only occasionally used. These processes are, for example, the controlled implantation of foreign ions such as hydrogen or nitrogen, which are occasionally used for example in the case of low-oxygen material (typical oxygen content $10^{12} - 10^{16}$ atoms/cm$^3$), such as is obtained, by crucible-free zone pulling.

Regardless of the method by which the regions with intrinsic gettering action are produced in a particular case, the average breakdown strengths can, however, be increased reproducibly and with satisfactory yield only to certain limit values where silicon wafers are produced and pretreated in the usual manner. The typical values at which the oxide layers lose their insulation capability for the standard silicon qualities vary, depending on the respective test methods used. Such methods are explained, for example, in *Philips J. Res.* 40, No. 3, 1985.

SUMMARY OF THE INVENTION

It is the object of the invention to provide silicon wafers and processes for the manufacture thereof which permit the reproducible and high yield production of oxide layers having an increased average breakdown strength.

Accordingly, this object is achieved by producing silicon wafers by a process which comprises subjecting at least one silicon wafer surface to a smoothing treatment before the production of such oxide layers and after a treatment effecting the formation of regions in the interior of the wafer having gettering action. If necessary, the smoothing step is performed after removing compounds formed on the surface during the process.

The treatment step which is inserted before the smoothing treatment of the wafer surface and in which regions with the gettering action are formed in the interior of the wafer can be carried out in a well known manner. This applies, in particular, to wafers of crucible-pulled material which are in general subjected to a thermal treatment cycle to form oxygen precipitates as intrinsic getters. Such a cycle may comprise bringing the wafers, as explained, for example, in the literature cited above, to temperature levels in the range between 700 and 1200° C. for certain periods of time or running them through certain temperature sequences having, for example, a ramp-like profile. In this connection, reference may be made to the paper entitled, "Oxygen Precipitation and MOS Leakage after a Process Heat Simulation" by K. D. Beyer et al., J. Electrochem. Soc. Vol. 134, No. 7, July 1987, pages 1753–1755 and also to the literature cited therein. This literature presents some possible temperature steps and sequences for producing precipitates with intrinsic gettering action in silicon wafers. For this purpose, a process is also often used in which a treatment of the wafers lasting approximately 4–8 hours at approximately 1100–1200° C. in an oxygen-free atmosphere is first used. A subsequent treatment step is then utilized lasting approximately 4–16 hours at approximately 700–800° C., after which the wafers are finally held for a further approximately 1–10 hours at about 1000–1200° C. and then removed from the annealing furnace. In these steps oxygen or oxygen-containing gas mixtures have proved successful as a working atmosphere.

In addition to this procedure which is most commonly used at the present time, other processes which produce gettering ions in the interior of the wafer, such as, the method of ion implantation of, for example, hydrogen or nitrogen, mentioned above are obviously also possible.

In order to make possible an effective smoothing treatment of the wafer surface, the silicon reaction products possibly formed on the wafer in the course of the prior treatment steps are removed before this step. In the course of the precipitation, for example, a thin oxide layer usually forms on the wafer surface. This can be removed in the known manner, for example, by etching it off by means of hydrofluoric acid or mixtures containing hydrofluoric acid. In general, briefly dipping the wafers in an etching bath or spraying them with etching solution is adequate for this purpose.

The actual smoothing treatment is preferably carried out in the form of a polishing step. It has been found that this step is not a polishing associated with considerable material removal, but a polishing step which chiefly effects the smoothing out of the remaining minimum irregularities in the wafer surface which is essential for a good result. Such steps are known from numerous multi-stage polishing processes and are typically used at the end of the process as the final stage in order to produce a satisfactorily haze-free surface on the wafer which has been polished with material being removed.

Such processes are described in German Offenlegungsschrift 2,247,067 and the corresponding U.S. Pat. No. 3,874,129, and in German Offenlegungsschrift 2,531,431 and the corresponding U.S. Pat. No. 4,070,799. This art teaches that in the final step of the polishing operation, a monohydric alcohol and a polyvinyl alcohol or an anion-active and/or non-ionogenic surfactant containing no nitrogen in the molecule is added to the polishing agent in order to render the surface haze-free. In addition, the pH of the polishing agent may also be reduced to the region of 3-8. Organosilicon compounds, such as, for example, trimethylsilanol, are also suitable as additives. Moreover, for example, the reduction of the polishing pressure and/or the use of special polishing cloths may also contribute to the production of a haze-free surface accompanied by only a small removal of material during polishing.

Typical polishing machines which are well known to those skilled in the art are suitable for carrying out the polishing step within the framework of the process according to the invention. It is desirable to use two-side polishing machines since with these machines the wafers do not have to be cemented in position and consequently there is a smaller contamination risk. In addition to their gettering action, the wafers thus obtained are especially outstanding for their geometrical precision. Use of single-side polishing machines is indicated to treat semi-conductor wafers where the rear surface of the wafer has gettering action, for example, owing to a mechanical treatment frequently described in the art as "damage". Such damage is due to sandblasting, immersion in a fluid bath or by controlled scratching by means of abrasive particles bound in an elastic carrier medium. Such methods are explained, for example, in U.S. Pat. No. 4,587,771 or the corresponding German Offenlegungsschrift 3,148,957 and are well known to those skilled in the art.

The amount of material removed by polishing is generally kept as low as possible; experience shows that the upper limits are removals of up to 10 $\mu$m, preferably up to 3 $\mu$m. Even removals of less than 1 $\mu$m are often adequate. Subsequent to the polishing treatment, the wafers may then be passed, possibly after a cleaning step, to the further component production process. Obviously, the surface quality achieved during polishing must meet the requirements of this process. The surface quality may be monitored and ensured, for example, by checks of the random-sample type using the method specified in ASTM Standard F 1048 (1987) in which the quality of the surfaces is assessed by means of a standardized scattered light measurement.

In addition to the polishing, other methods for the smoothing treatment of the wafer surface are also suitable provided they guarantee an adequate surface quality for the subsequent processes. For example, an incipient melting of the wafer surface may be used for the smoothing treatment by exposing the surface to electromagnetic radiation, preferably light radiation. This may be accomplished by means of mercury vapor lamps, by which irregularities in the surface profile can be made smooth. Etching mixtures which have the characteristic of reducing deviations of the real wafer surface from the geometrically ideal surface may be used. Examples of such known etching mixtures are the so-called "bright etches", such as, acid etches based on HF/HNO$_3$ mixtures in the ratio of 9:1 which can be used at room temperature, or alkaline etches with a KOH content of 25% by weight, which can be used at approximately 80° C.

It is expedient to follow the smoothing treatment of the wafer surface by a cleaning stage in which any contaminants of a mechanical or chemical type which are present, such as, for example, adhering particles or troublesome chemical residues, are removed. This is done, for example, by rinsing once or several times with high-purity water, if necessary in combination with an ultrasonic treatment. Suitable cleaning processes are known and can be designed, for example, by analogy with the processes carried out within the framework of the wafer production subsequent to the polishing process. After subsequent drying, the wafers are then available for further processing.

Surprisingly, the thin oxide layers on the silicon wafers obtained by the process described herein, have a markedly higher breakdown strength than the wafers having an identical pretreatment but not treated in the manner according to the invention. This is all the more astonishing because in both cases wafers polished in the normal manner, i.e., wafers whose surface quality meets the highest requirements, are used as starting material for the treatment producing gettering regions in the interior of the wafer. For these reasons, even where the hitherto usual processes are used in which gate oxide layers are produced on intrinsically gettering silicon wafers, strict care is taken to ensure that the wafer surface is not exposed to mechanical stresses of any kind subsequent to the substep which produces the gettering regions.

A possible explanation for this unexpected effect lies in the fact that a slight roughening of the wafer surface occurs in such a substep. It has been possible to actually detect such an effect with wafers of crucible-pulled silicon after the oxygen precipitate formation carried out by a thermal treatment cycle. The method of measurement utilized was the extremely sensitive laser scanning and scattered light measurement (as specified in German Patent application No. P 3,637,477.6), the measured curves of which revealed a slight increase in the surface roughness in wafers pretreated in such a manner compared with the original polished surface.

This characteristic may also be used to distinguish wafers produced by the process according to the invention from conventional wafers which have been pretreated in the same manner and contain oxygen precipitates as intrinsic gettering centers and which have not undergone any post treatment surface smoothing operation.

Owing to the high breakdown strength of the oxide layers deposited, it is possible to use silicon wafers obtained by the process according to the invention with particular advantage as substrates in those processes in which this characteristic acquires a special importance. Examples of this are the production of storage elements with high packing density or highly integrated switching circuits.

The invention will now be described in further detail with reference being made to the following example. It should, however, be recognized that the example is given as being illustrative of the present invention and is not intended to define the spirit and scope thereof.

EXAMPLE

A silicon rod obtained by Czochralski crucible pulling (p-doping, specific resistance approximately 1–10 Ohm/cm, (100) orientation) was sawn into wafers by means of an annular saw; these were then lapped in the usual manner and polished on both sides so as to be haze-free with the aid of a two-side polishing machine. The surface quality of the wafers obtained was determined with the aid of the laser scanning and scattered light measurement method specified in German Patent application P. 3,637,477.6. The results were compared with a reference wafer polished so as to be satisfactorily haze-free and in fact conformed to this quality standard.

Twelve (12) wafers (diameter approximately 10 cm, thickness approximately 450 μm) were now removed, in pairs, corresponding to six different positions along the length of the rod and subjected to a temperature treatment to produce oxygen precipitates with intrinsic gettering action. According to measurements as specified in DIN 50,438 of the corresponding ASTM Standard F 81, the oxygen content of the material was approximately $8 = 10^{17}$ atoms of oxygen/cm$^3$. In a first step, the wafers were held in an annealing furnace for approximately 6 hours at a temperature of approximately 1100° C. in an argon atmosphere. The temperature was then reduced to approximately 750° C. and the treatment was continued for approximately 6 hours with approximately 10% by volume of dry oxygen being added to the working atmosphere. Then the temperature was increased to approximately 1000° C. and allowed to act on the wafers for a further 6 hours with the dry oxidizing atmosphere being maintained. This concluded the precipitation step and it was possible to remove the wafers. Finally, the oxide layer formed on the wafer surface was etched off by a brief immersion in an approximately 6% by weight hydrofluoric acid bath.

The pairs of wafers were now divided with 6 wafers remaining untreated and the other 6 wafers being subjected to a polishing step in a commercial two-side polishing machine. A polishing solution was used which was adjusted to a pH of 7 and containing approximately 5% by volume of silicic acid sol and to which about 0.5% by volume of trimethylsilanol had been added. The polishing operation—a process variant suitable for producing a haze-free surface with little removal of material—lasted about 5 minutes; the amount of material removed was about 0.3 μm. A subsequent measurement of the surface quality again resulted in the original quality class, whereas, in the case of the untreated wafers, an increase in the surface roughness, albeit slight but nevertheless measurable, could be detected.

Both the wafers given a smoothing treatment and the untreated wafers were now subjected to an oxidation step. For this purpose, both groups of wafers were kept in an oxidation furnace having an argon atmosphere containing approximately 10% by volume of dry oxygen for approximately 15 minutes at about 1000° C. Under these circumstances, a thin oxide layer formed on the wafer surfaces, the thickness values varying between 283 and 294Å. These values were determined by measurement using an ellipsometer.

The wafers obtained were now checked for the breakdown strength of the thin oxide layers produced on their surface. The measurement method used was a test using the principle described in D. R. Wolters', "Growth, Conduction, Trapping and Breakdown of SiO$_2$ Layers on Silicon", Dissertation, Groningen/Netherlands, 1985. This test makes it possible to assess the quality of wafers in relation to the gate oxide layers produced and, consequently the suitability of the material for sophisticated highly integrated components.

Next, MOS (Metal Oxide Semiconductor) structures, the surface of which was about 0.0004 cm$^2$, were produced on the oxide layer by vapor deposition of aluminum. The rear side of the wafer was then metallized. The breakdown behavior of the oxide was determined by applying a voltage to each of 70 of these components and by continuously increasing the voltage while measuring the current intensity occurring in the process. A component was always regarded as having broken down if the current flowing through it had reached an intensity of 0.15 μA. The associated value for the voltage was also used to determine the corresponding intrinsic breakdown field strength. This associated value for the voltage represents the really critical parameter for the gate oxide quality since it is purged of production-induced premature breakdowns and is related to the material.

For the evaluation, the percentage of the components which had broken down at a certain voltage was compared in each case for both groups of wafers. In the case of the unpolished wafers, only about 4% of the elements had broken down up to a field strength of 8 MV/cm. After that point, however, a teep increase in breakdown set in and, at field strengths of between 8.8 and 9.0 MV/cm, 98% of the elements had broken down. In the group of wafers repolished after the precipitation, this steep increase started only in the range between 10.5 and 11.0 MV/cm, and only at 11.0 to 11.4 MV/cm had 98% of the elements broken down. The silicon wafers obtained from the process taught herein are therefore outstanding for a markedly increased intrinsic breakdown field strength as compared with the conventionally produced wafers.

While one embodiment and example of the present invention has been illustrated and described, it is obvious that many changes and modifications may be made thereunto, without departing from the spirit and scope of the invention.

What is claimed is:

1. A process for producing an oxide layer of high breakdown strength on a semiconductor wafer having an interior thereof exhibiting regions of gettering action, which has been produced by a heat treatment, comprising the steps of:
   heating the semiconductor wafer to produce oxygen precipitations exhibiting an intrinsic gettering action in the interior of the semiconductor wafer;
   smoothing at least one surface of the semiconductor wafer to reduce surface irregularities; and
   heating the semiconductor wafer in an oxygen-container atmosphere for a predetermined time to form the oxide layer on said at least one surface after smoothing thereof.

2. The process as set forth in claim 1, wherein compounds formed on the at least one surface of the wafer are removed by etching prior to the smoothing treatment.

3. The process as claimed in claim 1, wherein the smoothing treatment is a polishing step.

4. The process as claimed in claim 3, wherein a surface layer up to 10 μm thick is removed by the polishing step.

5. The process as claimed in claim 1, wherein the smoothing treatment is a polishing step effecting the production of a haze-free wafer surface.

6. The process as claimed in claim 5, wherein a surface layer up to 10 μm thick is removed by the polishing step.

7. The process as claimed in claim 1, wherein the smoothing treatment is carried out by irradiating the surface with electromagnetic radiation.

8. The process as claimed in claim 7, wherein the electromagnetic radiation is light radiation.

9. The process as claimed in claim 1, wherein the smoothing treatment is carried out by exposure to etching solutions.

10. A process for producing oxide layers of high breakdown strength on the surface of semiconductor wafers comprising:
 heating the semiconductor wafers in an oxygen-free atmosphere at a temperature in the range of 1,100°–1,200° C. for a first predetermined time;
 cooling the semiconductor wafers to a temperature in the range of 700°–800° C. and introducing an oxygen-containing atmosphere after said heating in an oxygen-free atmosphere and subsequently re-heating the semiconductor wafers for a second predetermined time at a temperature in the range of 1,000°–1,200° C.;
 etching-off an oxide layer formed by heating the semiconductor in the oxygen-containing atmosphere;
 smoothing at least one surface of the semiconductor to reduce surface irregularities; and
 heating the semiconductor wafer in an oxygen-containing atmosphere for a third predetermined time to form the oxide layer on said at least one surface after said smoothing thereof.

11. The process as claimed in claim 10, wherein said first predetermined time is approximately 4–8 hours.

12. The process as claimed in claim 10, wherein said second predetermined time is approximately 1–10 hours.

13. A process for producing oxide layers of high breakdown strength on the surface of semiconductor wafers comprising:
 heating the semiconductor wafers in a oxygen-free atmosphere at a first predetermined temperature for approximately 4–8 hours;
 cooling the semiconductor wafers to a temperature in the range of 700°–800° C. and introducing an oxygen-containing atmosphere after said heating in an oxygen-free atmosphere and subsequently re-heating the semiconductor wafers for approximately 1–10 hours to a second predetermined temperature;
 etching-off an oxide layer formed by heating the semiconductor in the oxygen-containing atmosphere;
 smoothing at least one surface of the semiconductor to reduce surface irregularities; and
 heating the semiconductor wafer in an oxygen-containing atmosphere for a predetermined time to form the oxide layer on said at least one surface after said smoothing thereof.

14. The process as claimed in claim 13, wherein said first predetermined temperature is a temperature in the range of 1,100°–1,200° C.

15. The process as claimed in claim 13, wherein said second predetermined temperature is a temperature in the range of 1,000°–1,200° C.

16. A silicon wafer comprising:
 an interior containing oxygen precipitations exhibiting an intrinsic gettering action; and,
 a front side and a rear side, at least one of said front side or said rear side having been given a polishing treatment before the formation of said interior and a smoothing treatment after the formation of said interior.

17. The silicon wafer as claimed in claim 16, having a wafer surface with gettering action situated opposite a wafer surface given a smoothing treatment.

18. The silicon wafer as claimed in claim 16, having surfaces situated opposite each other which have been give a smoothing treatment.

* * * * *